METHOD OF MAKING CONTACTS ON SEMICONDUCTORS

Filed Nov. 6, 1963 2 Sheets-Sheet 1

INVENTORS
Seymour Katz &
Edwin J. Miller
E. J. Wallace
ATTORNEY

INVENTORS
Seymour Katz &
Edwin J. Miller
R. J. Wallace
ATTORNEY

United States Patent Office 3,336,160

Patented Aug. 15, 1967

3,336,160

METHOD OF MAKING CONTACTS ON SEMICONDUCTORS

Seymour Katz, Oak Park, and Edwin J. Miller, Detroit, Mich., assignors to General Motors Corporation, Detroit, Mich., a corporation of Delaware Filed Nov. 6, 1963, Ser. No. 321,819
15 Claims. (Cl. 117—227)

This invention relates to semiconductors and more particularly to a method of making electrical contacts onto semiconductor bodies such as silicon.

Nickel coatings applied to semiconductor surfaces, particularly silicon surfaces, provide especially satisfactory ohmic contacts. Since a semiconductor has poor current carrying characteristics, a nonelectrolytic process of nickel deposition is used to apply the nickel coating. One method of nickel deposition that can be used to form nickel ohmic contacts involves reducing a nickel salt solution with sodium hypophosphite. Another method of nickel deposition which can be used involves thermal decomposition of nickel carbonyl. Both of the nonelectrolytic nickel plating processes referred to are comparatively costly and involve various ancillary problems in control. We have now found a new nickel plating method which can be used to more quickly and economically make a nickel contact on a semiconductor such as silicon that is even better than that heretofore obtainable. The problems associated with the hypophosphite-nickel deposits, i.e., brittle deposite, poor solderability, poor adhesion, double junctions, etc., are circumvented. In addition, our contacts exhibit lives three to five times longer in thermal fatigue tests.

It is, therefore, an object of the invention to provide both an improved semiconductor body and an improved method of making electrical contacts on semiconductor bodies.

These objects as well as other objects, features and advantages of the invention will become more apparent from the following description of preferred examples thereof and from the drawings, in which.

Briefly, the invention involves forming a nickel contact on a silicon semiconductor body by hydrogen reduction of a nickel salt solution buffered with ammonia and/or acetate ions at a carefully controlled temperature. The nickel deposition is effected at a pH above 2 and at an elevated temperature which is carefully regulated so as to maintain the temperature below a critical limit with respect to the nickel ion concentration, particularly as this concentration changes during nickel deposition.

Figures 1, 2:
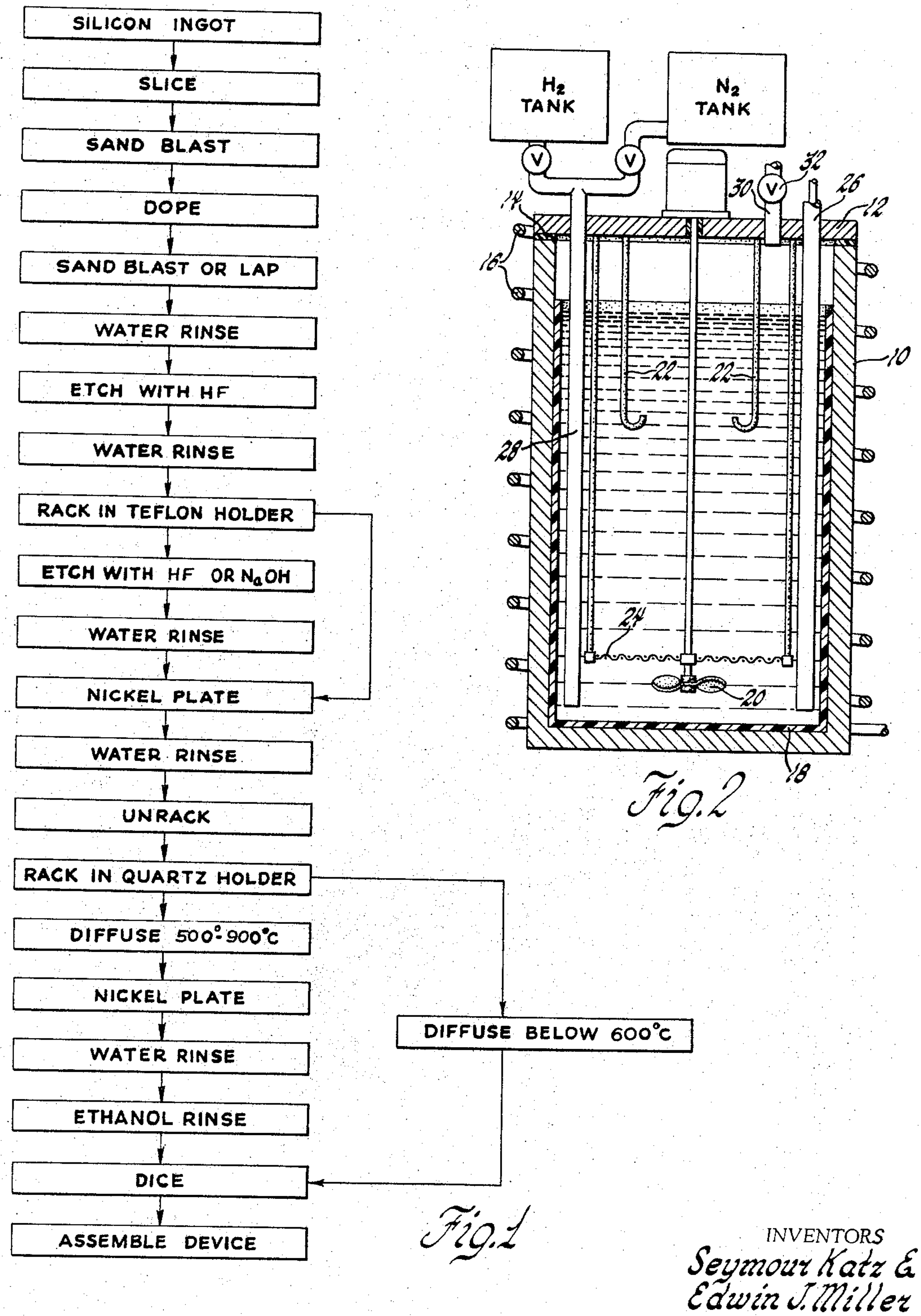
FIGURE 1 shows a flow diagram of a process for making a silicon semiconductor body useful in a signal translating device such as a diode.
FIGURE 2 shows an apparatus which can be used to deposit nickel coatings on silicon semiconductor bodies in accordance with our invention.

Before describing the specific method of nickel deposition, reference is made to FIGURE 1 for illustration of how this plating procedure is incorporated in the overall method of making a semiconductor body. FIGURE 1 shows a flow diagram of a process for making a silicon body for a diode. A monocrystalline silicon ingot of N-type conductivity is sliced to an appropriate thickness and each slice is then sand blasted to remove surface imperfections attributable to the slicing procedure. The opposite major surfaces of the slice are then doped, respectively, with opposite conductivity type impurities, such as phorphorus and boron, to form a rectifier body. The doping can be effected in any of the usual manners, such as by heating the silicon while it is in contact with a salt of the particular impurity. The salt can be applied to the specific surface involved in solution form. A salt solution of one impurity is applied to one major surface of a slice and the surface allowed to dry. A salt solution of the opposite conductivity impurity is applied to the opposite major surface and that surface allowed to dry. The slice is then heated to an elevated temperature to simultaneously diffuse the two impurities into the respective opposite major surfaces of the slice.

Thereafter, the slice is sand blasted or lapped on each surface and the abrasive rinsed off with water. It is then cleaned to prepare these surfaces for reception of the nickel deposit. A cleaning procedure which can be used involves etching with an aqueous hydrofluoric acid solution containing 48%, by weight, hydrofluoric acid. The slice is then rinsed with deionized water and racked in a Teflon holder. The slice is then ready for immediate nickel plating in the hereinafter described manner. If there is an appreciable time interval between the hydrofluoric acid etch and the nickel plating operation, the slice must be re-etched and rinsed, immediately prior to plating. A nickel coating of about 0.06 mil can be used. After plating, the part is rinsed with deionized water, removed from the Teflon rack and placed in a quartz holder. It is then preferably preheated in a nonoxidizing atmosphere up to a temperature of about 500° C.–900° C. for a sufficient duration (about 10 minutes) to interdiffuse at least a part of the nickel coating with the semiconductor body. The heating can be conducted in a hydrogen atmosphere, an inert gas or a vacuum. The slice is subsequently cooled, nickel plated again, rinsed with water, rinsed with alcohol and dried. It is then ready for dicing into appropriate sized wafers for assembly in the signal translating device.

In addition, we have found an added benefit using a diffusion temperature below about 600° C. for the initial nickel plate. Extremely satisfactory results can be obtained without a second nickel plate. In such instance, the results obtained by soldering the diode electrical leads directly to the initial nickel plate are as satisfactory as when soldering to the nickel overlay on the higher temperture diffused nickel plate.

However, in neither instance is it necessary to additionally employ gold plating as a final overlay, as is currently used in the production of commercial automotive rectifiers. The costly gold plating is eliminated. We solder directly to the nickel, not to gold.

For a description of the nickel plating process, reference is now made to FIGURE 2. The nickel coatings are applied to the silicon body by hydrogen reduction of a nickel salt solution at an elevated temperature and pressure. For this reason, the process must be conducted in an autoclave apparatus, such as shown in FIGURE 2. The autoclave includes a steel cup-shaped container portion 10 having a steel cover member 12 for closing its open end. An O-ring 14 is used to seal the cover member 12 to the container 10. A heater 16 surrounds the container 10. Suitable means (not shown) are provided to control the heater to regulate the temperature within container 10. A polytetrafluoroethylene (Teflon) liner 18 containing a plating bath is disposed within the container 10. The liner may be a separate cup-shaped member which is removable from the container 10, or it may be a coating which is applied to the inner wall of container 10. A Teflon propeller-type stirrer 20 depends into the liner 18 through cover member 12. Teflon holders 22 depending from the cover member 12 support the slice holders 24 within the liner 18. A closed-ended tube 26 depends into the liner 18 from the cover member 12. The tube 26 serves as a well for receiving temperature measuring devices (not shown) to monitor the temperature of the bath solution within the apparatus. An open tube 28 projects through cover 12 down almost to the bottom of liner 18. This tube is connected through appropriate valves to a hydrogen tank and to a nitrogen tank to permit introduction of either, or both, nitrogen and hydrogen gases into the interior of the apparatus after it has been closed. Tube 30 serves as a gas exhaust opening in cover 12. It has a valve 32 therein to seal this cover opening to maintain a positive pressure within the apparatus, as is desired.

We have found that a nickel salt solution buffered with ammonia and/or acetate ions provides the highly satisfactory unexpected results of our invention. By "ammonia" as used herein, we refer to ammonium hydroxide, an aqueous solution of ammonia. These bath solutions and techniques for using them are described in United States patent applications A–3550 and A–3659 which are being filed simultaneously herewith in the name of Seymour Katz and which are incorporated herein by reference. The plating processes disclosed in these patent applications unexpectedly provide highly satisfactory nickel deposits. However, in addition we found these processes can be used to make improved semiconductor devices, such as silicon rectifiers.

The following serves as a specific example of how a nickel contact can be deposited using a nickel salt solution buffered with ammonia. A quantity of an aqueous nickel bath formulated as follows is placed in the Teflon container 18 shown in FIGURE 2 in sufficient volume to completely cover the slice to be plated:

| | | |
|---|---|---|
| Nickel chloride | moles per liter | .16 |
| Ammonium hydroxide | do | .32 |
| Ammonium chloride | do | 1.9 |
| Anthraquinone | milligrams per liter | 200 |

The slice is supported within the liner immersed in the bath. The cover is placed on the autoclave, the exhaust valve 32 closed and the autoclave purged with nitrogen. It is pressurized to about 400 pounds per square inch (p.s.i.) with nitrogen. The exhaust valve 32 is then opened and the nitrogen discharged. This is repeated twice in immediate succession. Exhaust valve 32 is then closed and the introduction of nitrogen stopped. After purging the autoclave with nitrogen, the bath is heated at a rate of approximately 2.8° F. per minute to a temperature of approximately 260° F. Hydrogen is then bubbled into the bath until a hydrogen partial pressure of about 600 p.s.i. is obtained in the autoclave. This temperature is maintained for approximately 36 minutes whereupon substantially all of the nickel in the bath is expended. The residual plating solution is about 0.001 molar with respect to nickel. A nickel film thickness of about 0.0005 inch is produced. Thereafter, the introduction of hydrogen into the autoclave is discontinued and the autoclave allowed to cool. When the autoclave has cooled to room temperature, the hydrogen pressure is released, the autoclave is opened, and the part removed from the bath and rinsed.

An acetate-containing nickel bath that can be used is as follows:

| | | |
|---|---|---|
| Nickel acetate | moles per liter | 0.083 |
| Sodium acetate | do | 0.050 |
| Anthraquinone | grams per liter | 0.2 |

A sufficient quantity of the bath is placed in the Teflon liner 18 to cover the slices and the liner placed in container 10. The slices are then each supported in the bath to expose both major surfaces to the solution, and the cover 12 placed on the container. The cover 12 is secured, the exhaust valve 32 closed and the autoclave then purged with nitrogen. Purging is effected as described in the preceding example. After purging, the exhaust valve is closed, the flow of nitrogen stopped and hydrogen introduced. When a hydrogen partial pressure of about 400 p.s.i. is obtained, the bath is heated at a rate of about 1.7° F. per minute to a temperature of about 270° F. A temperature of about 270° F.–290° F. is maintained for about two hours. The heating and hydrogen introduction are then terminated. When the autoclave has substantially cooled, the exhaust valve is opened, the autoclave cover is removed, and the part taken from the bath and rinsed.

In general, any soluble nickel salt can be used in the preparation of the bath to use in practicing our process. While nickel salts, such as nickel sulfamate, nickel fluoborate, nickel borate and the like, may be useful, we prefer to employ a nickel salt, such as nickel acetate, nickel chloride or nickel sulfate.

Analogously, the acetate ion-producing substance can be acetic acid and/or virtually any acetate salt which is soluble in the bath solution and which does not objectionably complex with the nickel to deleteriously interfere with the proposed nickel deposition. Acetate salts, such as nickel acetate, sodium acetate, potassium acetate, lithium acetate and ammonium acetate, are generally satisfactory. Hence, it can be seen that nickel acetate can be used alone in the bath. However, it is generally desirable to also include another acetate ion-producing substance to the bath, for reasons which are subsequently clearer. Moreover, if desired, a plurality of nickel salts and acetate salts can be simultaneously employed in the same bath. The preferred concentration of salts in the aqueous bath is dependent upon the desired nickel ion and acetate ion concentrations, as is hereinafter described.

In the ammonia buffered bath, an ammonium salt is used as a source of ammonium ions which apparently complex the nickel to permit higher concentrations of nickel to be used, as is hereinafter pointed out more fully. Virtually any ammonium salt which is soluble in the bath solution and which does not objectionably complex with the nickel to deleteriously interfere with the proposed nickel deposition can be used. Substances, such as ammonium borate, ammonium iodide and the like, are generally satisfactory. However, we prefer to employ ammonium sulfate or ammonium chloride.

The pH of the bath solution must be at least about 2. If the bath becomes more acid then about pH 2, deposition ceases. On the other hand, a pH above about 7 in the acetate buffered bath and about 9 in the ammonia buffered bath are generally to be avoided in order to preclude precipitation of nickel hydroxide in the bath. Nickel hydroxide ordinarily precipitates in an aqueous bath above a pH of about 7. However, the higher ammonium ion concentration in the ammonium hydroxide bath apparently prevents this precipitation up to about pH 9. Of course, it is conceivable that appropriate complexing agents may permit use of an even more alkaline bath. Since the bath increases in acidity as the nickel is reduced, it is usually desirable to formulate the bath so it is at least pH 3 and preferably at a relatively high pH within the operating range. Generally, we prefer to formulate the acetate bath to have pH 5–6 and the ammonia bath to have pH 6–8.

The nickel ion concentration can vary from even small but effective amounts, e.g., about 0.01 gram per liter, up to saturation. However, for most purposes, a nickel ion concentration of at least 0.5 gram per liter is necessary in order to obtain a satisfactory plating rate. In the ammonia bath best plating rates are obtained at about 10–20 grams per liter. Concentrations in excess of 20 grams per liter require undesirably high ammonium ion concentrations which decrease plating rate. On the other hand, excesses of acetate ion do not appreciably affect the plating rate. Hence, in the latter type baths, large nickel ion concentrations can be used if one so desires.

However, as previously indicated, the nickel ion concentration to be used is related to the deposition temperature or, for a given nickel ion concentration, the temperature must not be allowed to exceed a certain critical limit. In general, the higher the nickel ion concentration is, the lower the plating temperature that must be used. Where the nickel ions are not complexed to any appreciable extent, such as in an acetate buffered bath, the maximum plating temperature is a function of the actual nickel ion concentration. By actual nickel ion concentration, we mean the total quantity of nickel per unit volume of the bath. On the other hand, if a portion of the nickel ions is complexed by additives in the bath, such as in our ammonia buffered bath, the maximum plating temperature is a function of the effective nickel ion concentration. By effective nickel ion concentration, we refer to that portion of the nickel ion in the solution which is not complexed. Hence, in the ammonia buffered bath, the plating temperature is also a function of the ammonium ion concentration as well as the nickel ion concentration. Thus, a higher plating temperature can be used for a given nickel ion concentration than in an acetate bath. For a better understanding of this, specific reference is now made to the ammonia buffered bath.

The ammonia, ammonium hydroxide, primarily serves as a buffer in the bath to maintain the pH in the bath within the desired operating range. Thus, the preferred minimum concentration of ammonia depends primarily upon the nickel ion concentration and secondarily upon the amount of nickel to be deposited. A molar ratio of at least about 2:1 of ammonia to nickel ion is needed to buffer the bath for deposition of substantially all the nickel in the bath. However, higher ammonia proportions can be used, even up to molar ratios of 6:1. It is generally economically undesirable to use ammonia to nickel ion molar ratios of less than 1:1.

Figure 3:
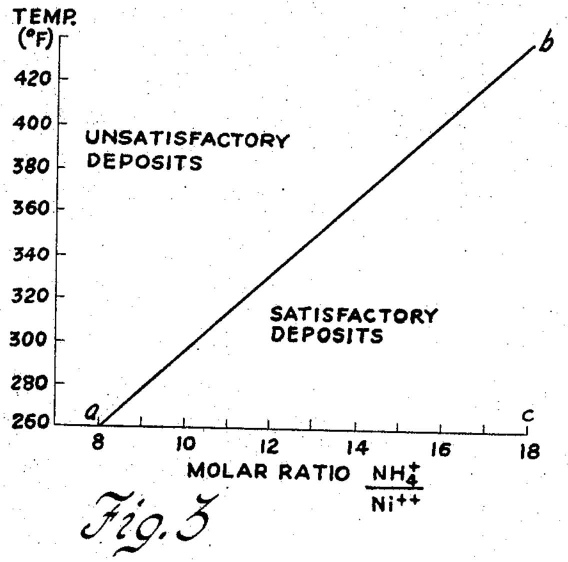
FIGURE 3 shows a graph in which the ratio of nickel ion concentration to ammonium ion concentration in a first plating bath used in the invention is plotted against temperature.

The ammonium salt is used in the bath as a source of ammonium ions to expand the range of useful nickel ion concentration and permit use of higher plating temperatures. Due to its limited ionization, ammonia has only a relatively negligible ammonium ion concentration and is, therefore, considered as undissociated. Hence, the ammonium salt is used, which is considered completely ionized for purposes of this discussion. The required concentration of ammonium ions from the salt is a direct function of both the nickel ion concentration and the plating temperature. The ammonium concentration must be increased if the nickel concentration is increased. Moreover, higher molar ratios of ammonium ions to nickel ions are required to get satisfactory deposits at higher plating temperatures. FIGURE 3 illustrates how this molar ratio varies with temperature. In the graph in FIGURE 3, temperature is the ordinate and the molar ratio of ammonium ions to nickel ions is the abscissa. Within the area *abc*, uniform, adherent, bright and smooth decorative nickel films can be obtained. This graph, which is representative of baths having a 2:1 ammonia to nickel ion molar ratio, is characteristic of all baths within the scope of our invention. Slight shifts in this curve may be found in baths having different ammonia-nickel ion molar ratios, and the representative curve is intended, by way of illustration, to also include these other baths.

On the other hand, the preferred maximum concentration of ammonium ions from the salt used is governed by the acceptability of an associated corresponding decrease in plating rate. We have found that the higher the concentration of ammonium ions, the slower the plating rate. Hence, we prefer to use as low an ammonium ion concentration as is permissible to still attain the fruits of the invention. Accordingly, it is generally undesirable to employ an ammonium ion concentration which is appreciably in excess of that described as required in the graph shown in FIGURE 3. Hence, the initial ammonium ion to nickel ion ratio desired for the bath not only depends upon the initial nickel ion concentration and the initial deposition temperature to be used but also on the plating rate desired.

Figure 4:
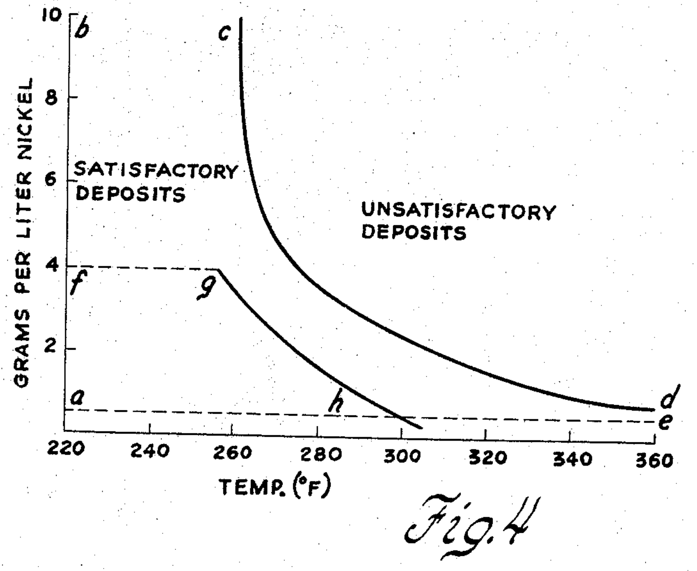
FIGURE 4 shows a graph in which nickel ion concentration in a second plating bath used in the invention is plotted against temperature.

The nickel ion concentration can be varied in the acetate buffered bath also. For a better understanding of how it can vary, reference is now made to FIGURE 4. FIGURE 4 shows a graph in which temperature is the abscissa and the concentration of nickel ions is the ordinate. This graph, obtained from an aqueous nickel acetate solution, is representative of those exhibited by various nickel baths which can be used in the process. Slight shifts in this curve may be found with some baths, and the representative curve is intended by way of illustration to also include these other baths which also exhibit the similar criticalities in nickel ion concentration and temperature. The area to the left and under the curve *cd* indicates the temperature-nickel ion concentration relationship where uniform, adherent, bright and smooth nickel films can be obtained. The curve *cd* apparently approaches an asymptote at about 260° F. for increasing nickel concentrations up to saturation. This higher concentration portion of the curve is not shown. Where exceptionally satisfactory deposits are desired, it is preferred to maintain the temperature-nickel ion concentration relationship within the area *afgh* of FIGURE 4.

Accordingly, for nickel ion concentrations less than about 10 grams per liter in an acetate buffered bath, it is desirable to use as high a temperature as is permissible within the area *abcde* indicated by FIGURE 4 as providing satisfactory deposits. Of course, if the initial nickel ion concentration is in excess of 10 grams per liter, the initial plating temperature should be as indicated by the curve *cd* in FIGURE 4 (e.g., about 260° F.).

As indicated in FIGURE 4, nickel ion concentrations are preferably at least 0.5 gram per liter. Larger concentrations, such as 10–20 grams per liter, can be used, but the plating temperature cannot be raised appreciably until the nickel ion concentration has dropped below about 10 grams per liter. The acetate ions in the bath essentially serve in buffering the bath to maintain it within the operating pH range. Thus, the preferred minimum concentration of acetate ions depends upon the nickel ion concentration and the amount of nickel which is to be deposited from the bath. On the other hand, the bath can accommodate appreciable excesses over this minimum amount without any significant effect on either deposit or plating rate. By way of illustration, about 0.4 mole per liter of acetate ion is enough to buffer a 10 gram per liter nickel ion solution for substantially complete reduction of the nickel therein. For some purposes it may be desirable to only use an equi-molar concentration of nickel ion and acetate ion. However, in most applications it is preferred that the acetate ion concentration be at least twice the molarity of the nickel ion concentration. Moreover, it is frequently desirable to employ a slight excess, 0.1–0.2 mole per liter of acetate ion to insure that an excess of acetate ion is present over any minimum which is considered desirable, particularly if the solution is to be buffered for substantially complete reduction of nickel. An alkali metal acetate salt is best used for the excess, or even the whole buffer, since it inherently tends to raise the pH of the resulting solution to permit one to use a higher initial pH.

Since the subject bath solution does not immediately form deposits on some materials, such as Teflon, it is desirable to make the container, agitator, work holder and various other apparatus components out of a substance which will not be immediately plated. In such instance, deposition solely occurs on the silicon slice and plating terminated before any plating commences on the apparatus parts.

In some instances I prefer to employ an accelerator, particularly one of the quinoid type, such as anthraquinone. Even small but effective amounts of the accelerator are useful. Significant accelerative effects are noted for accelerator concentrations of about 0.1 gram per liter for about each 10 grams of nickel ion in the bath. However, we prefer to use about 0.2 gram of accelerator to insure the consistent attainment of best results with all baths.

The reducing gases that can be used in depositing nickel from the described bath solutions include industrial reducing gas mixtures, carbon monoxide and the like. However, hydrogen provides the most satisfactory results. A hydrogen pressure of at least 50 p.s.i. is necessary to obtain an appreciable deposition rate. On the other hand, any higher pressure can be used. We generally prefer to employ hydrogen partial pressures of approximately 100–800 p.s.i. at temperatures from about 200° F.–350° F. Hydrogen pressures of about 200–400 p.s.i. are preferred for commercial production use.

Since plating rate varies directly with temperature, it is desirable to increase the plating temperature as the nickel ion decreases. However, the plating temperature increase must be regulated to correspond to the nickel ion concentration decrease. Fastest satisfactory plating rate is realized in the ammonia buffered bath when the temperature increase follows along the line *ab* of FIGURE 3 or, for the acetate, along the line *cd* of FIGURE 4.

Film deposition can be terminated with either of the types of baths described in any convenient manner, such as by reducing plating temperature, terminating hydrogen reduction, forming the bath to have the pH reach of about 2 after a predetermined amount of nickel has been deposited, and by forming the bath so it is substantially exhausted of nickel after a predetermined thickness of deposit has been obtained.

It is to be understood that while we have described our invention in connection with certain specific examples thereof, no limitation is intended thereby except as defined in the appended claims.

We claim:

1. In a process for making an electrical contact on a semiconductor body which comprises the principal steps of depositing a nickel coating on said body and subsequently heat treating said body to enhance the bond between said coating and said body, the improvement comprising a process for depositing a substantially pure, uniform, ductile, adherent nickel coating onto said semiconductor from a gas reduced solvated nickel solution which comprises the steps of contacting a clean semiconductor body with an aqueous nickel plating bath having a pH of at least about 2, said bath having a soluble nickel salt and a buffer sufficient to maintain the bath above about pH 2 during chemical reduction of at least a major proportion of the nickel in the bath, heating said bath to an elevated temperature to induce deposition of a nickel film on said body, contacting said bath with a pressurized gaseous atmosphere, regulating the temperature of said bath while plating such that said temperature varies inversely with respect to the concentration of dissolved nickel therein to produce a uniform, ductile, adherent and readily solderable coating of substantially pure nickel on said body.

2. The process for making a substantially pure, uniform, ductile, adherent electrical contact on a semiconductor body which comprises the steps of placing a clean semiconductor body in an aqueous nickel plating bath having a pH of at least about 2, said bath having a soluble nickel salt and a buffer selected from the group consisting of acetate ion and ammonia, said buffer being sufficient to maintain the said bath above about pH 2 during chemical reduction of at least a major proportion of the nickel in the bath, heating said bath to an elevated temperature to induce deposition of a nickel film on said body, said elevated temperature being below the nickel powder producing temperature of said bath, placing said bath in contact with a pressurized gaseous reducing atmosphere, continuously increasing the temperature of said bath after nickel deposition commences and during subsequent deposition, said subsequent temperatures being regulated with respect to the decreasing nickel ion concention in said bath in a manner such that no new powder producing temperature is exceeded to produce a uniform, adherent, ductile and readily solderable film of substantially pure nickel on said semiconductor body, removing said body from said bath, and thereafter heating said body to interdiffuse said film and said body.

3. The process for making a substantially pure, uniform, ductile, adherent electrical contact on a silicon semiconductor body which comprises the steps of placing a clean silicon semiconductor body in an aqueous nickel plating bath having a pH of at least about 2, said bath having a soluble nickel salt and a buffer sufficient to maintain the bath above about pH 2 during chemical reduction of at least a major proportion of nickel in the bath, said bath being in a polytetrafluoroethylene container, heating said bath to an initial elevated temperature to induce deposition of a nickel film on said silicon semiconductor body, said elevated temperature being below the nickel powder producing temperature of said bath, placing said bath in contact with a pressurized gaseous reducing atmosphere, increasing the temperature of said bath after nickel deposition commences to temperatures above said initial elevated temperature, said subsequent temperatures being regulated with respect to the decreasing nickel ion concentration in said bath in a manner such that no new powder producing temperature is exceeded to produce a uniform, adherent, ductile and readily solderable film of substantially pure nickel on said semiconductor body, completing said film formation before deposition of nickel commences on said polytetrafluoroethylene container, removing said body from said bath, and subsequently heating said body to interdiffuse said film and said body.

4. A process for making a substantially pure, uniform, ductile, adherent ohmic contact on a silicon rectifier which comprises the steps of placing a clean silicon semiconductor rectifier body in an aqueous nickel plating bath having a pH of at least about 2, said bath having a soluble nickel salt and a buffer selected from the group consisting of acetate ion and ammonia, said buffer being sufficient to maintain the bath above about pH 2 during chemical reduction of at least a major proportion of the nickel in the bath, heating said bath initially to an elevated temperature to induce deposition of a nickel film on said body, said elevated temperature being below the nickel powder producing temperature of said bath, placing said bath in contact with a pressurized gaseous reducing atmosphere, after deposition has commenced increasing the temperature of said bath to above said initial temperature but keeping it within the film-producing temperature range as dictated by the decreasing nickel concentration of said bath, removing said body from said bath, subsequently heating said body to interdiffuse said film and said body, and forming a second nickel film on said body in the aforementioned manner without intermediate surface etching of said diffused nickel film.

5. The process for making a substantially pure, uniform, ductile, adherent ohmic contact on a semiconductor body which comprises the steps of placing a clean semiconductor body in an aqueous nickel plating bath having a pH of at least about 2, said bath having a soluble nickel salt and a buffer sufficient to maintain the bath above about pH 2 during chemical reduction of at least a major proportion of the nickel in the bath, heating said bath initially to an elevated temperature to induce deposition of a nickel film on said body, said elevated temperature being below the nickel powder producing temperature of said bath, placing said bath in contact with a pressurized gaseous reducing atmosphere, subsequently increasing the temperature of said bath after nickel deposition commences to temperatures above said initial temperature, said subsequent temperatures being regulated with respect to the decreasing nickel ion concentration in said bath such that no new powder producing temperature is exceeded to produce a uniform, adherent, ductile and readily solderable film of substantially pure nickel on said semiconductor body, removing said body from said bath, subsequently heating said body to interdiffuse said film and said body, forming a second nickel film on said body in the aforementioned manner without intermediate surface etching of said diffused nickel film, and thereafter soldering an electrical lead to said second nickel film.

6. The process of making a substantially pure, uniform, ductile, adherent electrical contact on a silicon semiconductor body which comprises the steps of placing a clean silicon semiconductor body having a PN junction therein in an aqueous nickel plating bath having a pH of at least about 2, said bath having a soluble nickel salt and a buffer selected from the group consisting of acetate ion and ammonia, said buffer being sufficient to maintain the bath above about pH 2 during chemical reduction of at least a major proportion of the nickel in the bath, heating said bath to an initial elevated temperature to induce deposition of a nickel film on said body, said elevated temperature being below the nickel powder producing temperature of said bath, placing said bath in contact with a pressurized gaseous reducing atmosphere, subsequently increasing the temperature of said bath after nickel deposition commences to temperatures above said initial temperature, said subsequent temperatures being regulated with respect to the decreasing nickel ion concentration in said bath such that no new powder producing temperature is exceeded to produce a uniform, adherent, ductile and readily solderable film of substantially pure nickel on said semiconductor body, removing said body from said bath, subsequently heating said body to interdiffuse said film and said body, and thereafter soldering an electrical lead to said nickel film.

7. In a process for making silicon rectifiers, the steps of placing a clean silicon semiconductor rectifier body in an aqueous nickel plating bath having a pH of about 3–7, said bath having a soluble nickel salt therein for producing a nickel ion concentration of at least about 0.5 gram per liter, an accelerator and a buffer selected from the group consisting of acetate ion and ammonia, said buffer being sufficient to maintain the bath above about pH 2 during chemical reduction of at least a major proportion of nickel in the bath, heating said bath to an initial elevated temperature to induce deposition of a nickel film on said silicon body, said elevated temperature being below the nickel powder producing temperature of said bath, providing a pressurized hydrogen atmosphere for said bath, subsequently increasing the temperature of said bath in relation to the decreasing nickel ion concentration therein such that no new powder producing temperature is exceeded to produce a uniform, adherent, ductile and readily solderable nickel film of substantially pure nickel on said silicon body, removing said body from said bath, and heating said body to interdiffuse said film and said body.

8. In a process for making silicon rectifiers, the steps of placing a clean silicon semiconductor rectifier body in an aqueous nickel plating bath having a pH of about 3–7, said bath having a soluble nickel salt therein for producing a nickel ion concentration of at least about 0.5 gram per liter, an accelerator and a buffer selected from the group consisting of acetate ion and ammonia, said buffer being sufficient to maintain the bath above about pH 2 during chemical reduction of at least a major proportion of nickel in the bath, heating said bath to an initial elevated temperature to induce deposition of a nickel film on said silicon body, said elevated temperature being below the nickel powder producing temperature of said bath, providing a pressurized hydrogen atmosphere for said bath, after deposition commences increasing the temperature of said bath and regulating said increasing temperature in relation to the decreasing nickel ion concentration therein in a manner such that no new powder producing temperature is exceeded to produce a uniform, adherent, ductile and readily solderable film of substantially pure nickel on said silicon body, removing said body from said bath, heating said body to interdiffuse said film and said body, forming a second nickel film on said body in the aforementioned manner without intermediate surface etching on said diffused nickel film, and thereafter soldering an electrical lead to said second nickel film.

9. The process for making a substantially pure, uniform, ductile, adherent electrical contact on a semiconductor body which comprises the steps of placing a clean semiconductor body in an aqueous nickel plating bath having an acidity of about pH 3–7, said bath containing a nickel salt selected from the group consisting of nickel chloride, nickel sulfate, nickel borate, nickel fluoborate, nickel sulfamate and nickel acetate, said salt providing a nickel ion concentration of about 0.5–20 grams per liter, ammonia and an ammonium salt selected from the group consisting of ammonium acetate, ammonium sulfate and ammonium chloride, the ratio of ammonium ion concentration to nickel ion concentration in the bath being at least about 8:1 when the temperature of said bath is in excess of about 260° F., providing a pressurized gaseous reducing atmosphere for said bath containing said body, heating said bath containing said body to an elevated temperature to induce deposition of a nickel film on said body, maintaining said bath containing said body at a temperature for producing a uniform, adherent, ductile and readily solderable film of substantially pure nickel by increasing the temperature of said bath in such relation to its decreasing nickel ion concentration during deposition of said film to avoid nickel particle formation, removing said semiconductor body from said bath, and heating said body to interdiffuse said film and said body.

10. The process for making a substantially pure, uniform, adherent, ductile electrical contact on a semiconductor body which comprises the steps of placing a clean silicon semiconductor body in an aqueous nickel plating bath having an acidity of about pH 3–7, said bath containing a nickel salt selected from the group consisting of nickel chloride, nickel sulfate, nickel borate, nickel fluoborate, nickel sulfamate and nickel acetate, said salt providing a nickel ion concentration of about 0.5–10 grams per liter and an acetate salt selected from the group consisting of sodium acetate, potassium acetate, lithium acetate, nickel acetate and ammonium acetate, the acetate ion concentration being at least about equal in molarity to the nickel ion concentration, providing a pressurized gaseous reducing atmosphere for said bath containing said body, heating said bath containing said body to an initial elevated temperature to induce deposition of a nickel film on said body, maintaining said bath containing said body at a temperature for producing a uniform, adherent, ductile and readily solderable film of substantially pure nickel by regulating the temperature of said bath upwardly from said initial temperature during deposition of said film and in such relation to the bath's decreasing nickel ion concentration that no powders are formed, removing said semiconductor body from said bath, and heating said body to interdiffuse said film and said body.

11. The process for making a substantially pure, uniform, adherent, ductile and readily solderable electrical contact on a semiconductor body which comprises the steps of placing a clean semiconductor body in an aqueous nickel plating bath having an acidity of about pH 3–9, said bath containing a nickel salt selected from the group consisting of nickel chloride, nickel sulfate, nickel borate, nickel fluoborate, nickel sulfamate and nickel acetate, said salt providing a nickel ion concentration of at least about 0.5 gram per liter, a quinonoid accelerator, ammonia and an ammonium salt selected from the group consisting of ammonium acetate, ammonium sulfate, and ammonium chloride, the ratio of ammonium ion concentration to nickel ion concentration in the bath being at least about 8:1, providing a reducing atmosphere containing hydrogen for said bath containing said body, said hydrogen being at a partial pressure of about 100–800 p.s.i., heating said bath containing said body initially to a temperature of at least about 200° F. to induce deposition of a nickel film on said body, after said deposition commences increasing the temperature of the bath above said initial temperature in such relation to decreases in nickel ion concentration in the bath that no powders are formed, removing said semiconductor body from said bath, heating said body to interdiffuse said film and said body, forming a second nickel film on said body in the aforementioned manner without intermediate surface etching of said diffused nickel film, and thereafter connecting an electrical lead to said second nickel film.

12. The process for making a substantially pure, uniform, adherent, ductile electrical contact on a semiconductor body which comprises the steps of placing a clean semiconductor body in an aqueous nickel plating bath having an acidity of about pH 3–7, said bath containing a nickel salt selected from the group consisting of nickel chloride, nickel sulfate, nickel borate, nickel fluoborate, nickel sulfamate and nickel acetate, said salt providing a nickel ion concentration of at least about 0.5 gram per liter, a quinonoid accelerator, an acetate ion-producing agent from the group consisting of acetic acid, sodium acetate, potassium acetate, lithium acetate and ammonium acetate, the acetate ion concentration being at least about equal in molarity to the nickel ion concentration, providing a reducing atmosphere containing hydrogen for said bath containing said body, said hydrogen being at a partial pressure of about 100–800 p.s.i., heating said bath containing said body initially to a temperature of at least about 200° F. to induce deposition of a nickel film on said body, after said deposition commences increasing the temperature of the bath above said initial temperature in such relation to decreases in nickel ion concentration in the bath that only a continuous nickel film is formed, removing said semiconductor body from said bath, heating said body to interdiffuse said film and said body, forming a second nickel film on said body in the aforementioned manner without intermediate surface etching of said diffused nickel film, and thereafter connecting an electrical lead to said second nickel film.

13. The process for making a substantially pure, uniform, adherent, ductile and readily solderable electrical contact on a semiconductor body which comprises the steps of placing a clean silicon semiconductor body in an aqueous nickel plating bath having an acidity of about pH 3–7, said bath containing a nickel salt selected from the group consisting of nickel chloride, nickel sulfate and nickel acetate, said salt providing a nickel ion concentration of about 0.5–4 grams per liter and an acetate salt selected from the group consisting of sodium acetate, potassium acetate, lithium acetate, nickel acetate and ammonium acetate, the acetate ion concentration being at least about equal in molarity to the nickel ion concentration, providing a pressurized gaseous reducing atmosphere for said bath containing said semiconductor body, heating said bath containing said body to an elevated temperature to induce deposition of a nickel film on said body, increasing the temperature of said bath after deposition of said film commences, while regulating the increasing temperature of said bath to maintain the temperature-nickel ion concentration relationship described within the area *afgh* of FIGURE 4, removing said semiconductor body from said bath, and heating said body to interdiffuse said film and said body.

14. The process for making a substantially pure, uniform, adherent, ductile and readily solderable electrical contact on a silicon semiconductor body which comprises the steps of placing a clean silicon semiconductor body in an aqueous nickel plating bath having an acidity of about pH 5–7, said bath containing a nickel salt selected from the group consisting of nickel chloride, nickel sulfate and nickel acetate, said salt providing a nickel ion concentration of about 0.5–4 grams per liter, a quinonoid accelerator and an acetate ion-producing agent selected from the group consisting of acetic acid, sodium acetate, potassium acetate, lithium acetate, nickel acetate and ammonium acetate, the acetate ion concentration being at least about twice the molarity of the nickel ion concentration, providing a reducing atmosphere containing a hydrogen for said bath containing said body, said hydrogen being at a partial pressure of about 100–800 p.s.i., heating said bath containing said body initially to a temperature of at least about 200° F. to induce deposition of a nickel film on said body, thereafter increasing the temperature of the bath above said initial temperature after said deposition commences, while regulating the increasing temperature of said bath during film formation to maintain the temperature-nickel ion concentration relationship described within the area *afgh* in FIGURE 4, and removing said semiconductor body from said bath.

15. An electrical contact on a semiconductor body produced by the process defined by claim 1.

References Cited

UNITED STATES PATENTS

| | | | |
|---|---|---|---|
| 3,062,680 | 11/1962 | Meddings | 117—130 X |
| 3,071,522 | 1/1963 | Sauer et al. | 117—130 X |
| 3,147,154 | 9/1964 | Cole et al. | 148—6.3 |

OTHER REFERENCES

Brenner: Metal Finishing, vol. 52, #1, November 1954, pp. 68–76, TVS200M587.

Serota: Metal Finishing, vol. 60, #9, September 1962, pp. 73–75, TS200M587.

ALFRED L. LEAVITT, *Primary Examiner.*

RALPH S. KENDALL, *Assistant Examiner.*